(12) United States Patent
Wu

(10) Patent No.: US 11,329,667 B2
(45) Date of Patent: May 10, 2022

(54) STREAM DECOMPRESSION CIRCUIT

(71) Applicant: Raydium Semiconductor Corporation, Hsinchu (TW)

(72) Inventor: Chih-Liang Wu, Taoyuan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 17/144,229

(22) Filed: Jan. 8, 2021

(65) Prior Publication Data
US 2021/0218415 A1    Jul. 15, 2021

Related U.S. Application Data

(60) Provisional application No. 62/961,295, filed on Jan. 15, 2020.

(51) Int. Cl.
*H03M 7/40* (2006.01)

(52) U.S. Cl.
CPC ................ *H03M 7/4093* (2013.01)

(58) Field of Classification Search
CPC .... H03M 7/4093; H03M 7/40; H03M 7/6023; H03M 7/6005; H04N 19/42; H04N 19/44
See application file for complete search history.

(56) References Cited

U.S. PATENT DOCUMENTS

| | | | | |
|---|---|---|---|---|
| 5,701,160 A * | 12/1997 | Kimura | ............... | H04N 19/172 375/240.14 |
| 5,781,788 A * | 7/1998 | Woo | ..................... | H04N 19/61 370/276 |
| 5,828,426 A * | 10/1998 | Yu | ......................... | H04N 19/61 375/240.26 |
| 6,313,863 B1 * | 11/2001 | Chida | .................... | H04N 7/147 348/14.01 |
| 6,493,384 B1 * | 12/2002 | Mihara | ................ | H04N 19/177 375/240.02 |
| 7,626,518 B2 * | 12/2009 | Hussain | .............. | H04N 19/197 341/51 |
| 8,218,644 B1 * | 7/2012 | Jones | ................... | H04N 19/523 375/240.16 |
| 2008/0198046 A1 * | 8/2008 | Ogawa | .................... | H03M 7/40 341/67 |
| 2008/0238733 A1 * | 10/2008 | Suzumura | ............. | H04N 19/13 341/67 |
| 2009/0168868 A1 * | 7/2009 | Jahanghir | ........... | H03M 7/4006 375/240.02 |
| 2011/0260894 A1 * | 10/2011 | Ku | ......................... | H03M 7/40 341/67 |

(Continued)

*Primary Examiner* — Lam T Mai

(57) ABSTRACT

A stream decompression circuit is disclosed. The stream decompression circuit includes a coding length first-in-first-out (FIFO) and a calculation circuit. The coding length FIFO is coupled to a variable length coding (VLC) circuit and used to store a coding length that the VLC circuit codes sub-streams and output a specific number of bits when the coding length accumulates over the specific number of bits. The calculation circuit is coupled between the coding length FIFO and a multiplexer circuit and used to calculate a number of bits required for decompression and output an output multiplex control signal to the multiplexer circuit to control the multiplexer circuit to output the sub-streams according to a specific order.

14 Claims, 6 Drawing Sheets

(56) References Cited

U.S. PATENT DOCUMENTS

2013/0300591 A1* 11/2013 Marpe ............... H03M 7/4006
  341/67
2014/0210652 A1* 7/2014 Bartnik ............... H04N 19/436
  341/67

* cited by examiner

| Coding length (Binary) {Y1,Co,Cg} | Coding length (decimal) {Y1,Co,Cg} | Calculating remaining bits (<36) | | | Flag | | |
|---|---|---|---|---|---|---|---|
| | | Y1 | Co | Cg | Y1 | Co | Cg |
| {000000,000000,000000} | {00,00,00} | 48 | 48 | 48 | 1 | 1 | 1 |
| {010101,100100,001001} | {21,36,09} | 27 | 12 | 39 | 1 | 1 | 0 |
| {001100,000101,000101} | {12,05,05} | 63 | 55 | 34 | 0 | 0 | 1 |
| {001000,011001,001100} | {08,25,12} | 55 | 30 | 70 | 0 | 1 | 0 |
| {001000,001000,000111} | {08,08,07} | 47 | 70 | 63 | 0 | 0 | 0 |
| {000100,001000,001001} | {04,01,01} | 43 | 62 | 54 | 0 | 0 | 0 |
| {000001,001100,001100} | {01,12,12} | 42 | 50 | 42 | 0 | 0 | 0 |
| {001001,000100,000100} | {09,04,04} | 33 | 46 | 38 | 1 | 0 | 0 |
| {000100,000001,000001} | {04,08,09} | 77 | 45 | 37 | 0 | 0 | 0 |
| {000101,000101,001101} | {05,05,13} | 72 | 40 | 24 | 0 | 0 | 1 |
| {000101,000100,000111} | {05,04,07} | 67 | 36 | 65 | 0 | 0 | 0 |

FIG. 3

STREAM DECOMPRESSION CIRCUIT

BACKGROUND OF THE INVENTION

1. Field of the Invention

The invention relates to stream; in particular, to realize a stream decompression circuit in the VESA display stream compression (DSC) multiplexer circuit with a simple and low-cost hardware architecture.

2. Description of the Prior Art

In general, the coded stream of VESA display stream compression (DSC) is formed by three sub-streams Y/Co/Cg (for example, Y:Co:Cg=4:4:4 mode). The three sub-streams Y/Co/Cg are processed by the variable length coder (VLC), the funnel shifter and the balance FIFO respectively and then enter the multiplexer.

Conventionally, the multiplexer is coupled to the stream decoder and determines an order of outputting the sub-streams to the rate buffer according to the number of bits consumed by the stream decoder when decoding the stream.

For example, the stream decoder can determine whether the number of bits left in the three sub-streams Y/Co/Cg in their respective funnel shifters is sufficient for decoding next data according to, for example, whether it is greater than or equal to 36 bits. If the above determination result is no, that is, the number of bits left in the funnel shifter of the sub-stream is not enough to decode the next data, it is necessary to load new undecoded streams to the balance FIFOs respectively for decoding the next data. This behavior becomes the sequence in which the multiplexer outputs the three sub-streams Y/Co/Cg to the rate buffer.

However, conventionally, if a stream decoder is to be implemented in hardware, it needs to include circuits such as a variable length decoder (VLD), a lookup table, a funnel shifter, etc. The circuit has a complicated and large circuit structure, and the cost of hardware circuit design has also increased significantly, which is not conducive to the competitiveness of the product in the market and needs to be improved.

SUMMARY OF THE INVENTION

Therefore, the invention provides a stream decompression circuit to effectively solve the above-mentioned problems in the prior art.

An embodiment of the invention is a stream decompression circuit. In this embodiment, the stream decompression circuit includes a coding length first-in-first-out (FIFO) and a calculation circuit. The coding length FIFO is coupled to a variable length coding (VLC) circuit and used to store a coding length that the VLC circuit codes sub-streams and output a specific number of bits when the coding length accumulates over the specific number of bits. The calculation circuit is coupled between the coding length FIFO and a multiplexer circuit and used to calculate a number of bits required for decompression and output an output multiplex control signal to the multiplexer circuit to control the multiplexer circuit to output the sub-streams according to a specific order.

In an embodiment of the invention, the VLC circuit includes a first variable length coder, a second variable length coder and a third variable length coder configured to code a first sub-stream, a second sub-stream and a third sub-stream of the plurality of sub-streams respectively.

In an embodiment of the invention, the first variable length coder, the second variable length coder and the third variable length coder are coupled to a first shifter, a second shifter and a third shifter respectively, the first shifter, the second shifter and the third shifter are configured to accumulate the coding length that the first variable length coder, the second variable length coder and the third variable length coder code the first sub-stream, the second sub-stream and the third sub-stream respectively and output the first sub-stream, the second sub-stream and the third sub-stream when the coding length accumulates over the specific number of bits.

In an embodiment of the invention, the first shifter, the second shifter and the third shifter are coupled to a first balance FIFO, a second balance FIFO and a third balance FIFO respectively, the first balance FIFO, the second balance FIFO and the third balance FIFO are configured to store the first sub-stream, the second sub-stream and the third sub-stream having the coding length equal to the specific number of bits.

In an embodiment of the invention, the multiplexer circuit is further coupled to the first balance FIFO, the second balance FIFO, the third balance FIFO and a rate buffer and configured to output the first sub-stream, the second sub-stream and the third sub-stream to the rate buffer in the specific order according to the flag of the multiplex control signal.

In an embodiment of the invention, the specific number of bits includes numbers of bits of the first sub-stream, the second sub-stream and the third sub-stream respectively.

In an embodiment of the invention, the specific number of bits is 18 bits including 6 bits of the first sub-stream, 6 bits of the second sub-stream and 6 bits of the third sub-stream respectively, while the multiplex control signal has 3 bits including 1 bit of the first sub-stream, 1 bit of the second sub-stream and 1 bit of the third sub-stream respectively.

An embodiment of the invention is a stream decompression circuit. In this embodiment, the stream decompression circuit is coupled between a variable length coding (VLC) circuit and a multiplexer circuit. The stream decompression circuit includes a calculation circuit and a flag first-in-first-out (FIFO). The calculation circuit is coupled to the VLC circuit and configured to calculate when the multiplexer circuit needs to output a plurality of sub-streams according to a coding length that the VLC circuit codes the plurality of sub-streams and output a multiplex control signal including a flag. The flag FIFO is coupled between the calculation circuit and the multiplexer circuit and configured to store the multiplex control signal, and the multiplexer circuit outputting the plurality of sub-streams in a specific order according to the flag of the multiplex control signal.

In an embodiment of the invention, when the VLC circuit includes a first variable length coder, a second variable length coder and a third variable length coder configured to code a first sub-stream, a second sub-stream and a third sub-stream of the plurality of sub-streams respectively.

In an embodiment of the invention, the first variable length coder, the second variable length coder and the third variable length coder are coupled to a first shifter, a second shifter and a third shifter respectively, the first shifter, the second shifter and the third shifter are configured to accumulate the coding length that the first variable length coder, the second variable length coder and the third variable length coder code the first sub-stream, the second sub-stream and the third sub-stream respectively and output the first sub-stream, the second sub-stream and the third sub-stream when the coding length accumulates over a specific number of bits.

In an embodiment of the invention, the first shifter, the second shifter and the third shifter are coupled to a first balance FIFO, a second balance FIFO and a third balance FIFO respectively, the first balance FIFO, the second balance FIFO and the third balance FIFO are configured to store the first sub-stream, the second sub-stream and the third sub-stream having the coding length equal to the specific number of bits.

In an embodiment of the invention, the multiplexer circuit is further coupled to the first balance FIFO, the second balance FIFO, the third balance FIFO and a rate buffer and configured to output the first sub-stream, the second sub-stream and the third sub-stream to the rate buffer in the specific order according to the flag of the multiplex control signal.

In an embodiment of the invention, the specific number of bits includes numbers of bits of the first sub-stream, the second sub-stream and the third sub-stream respectively.

In an embodiment of the invention, the multiplex control signal has 3 bits including 1 bit of the first sub-stream, 1 bit of the second sub-stream and 1 bit of the third sub-stream respectively.

Compared to the prior art, the stream decompression circuit of the invention does not require a stream decoder with a complicated circuit structure and a high hardware design cost to control the multiplexer circuit to output three sub-streams Y/Co/Cg in the VESA DSC coded stream to the rate buffer in the correct order, so the circuit architecture can be greatly simplified and the cost can be reduced, which helps to enhance the competitiveness of the product in the market.

The advantage and spirit of the invention may be understood by the following detailed descriptions together with the appended drawings.

BRIEF DESCRIPTION OF THE APPENDED DRAWINGS

FIG. 3 illustrates a schematic diagram of the flags of the three sub-streams Y/Co/Cg calculated by the calculation circuit in FIG. 2.

DETAILED DESCRIPTION OF THE INVENTION

Figure 1:
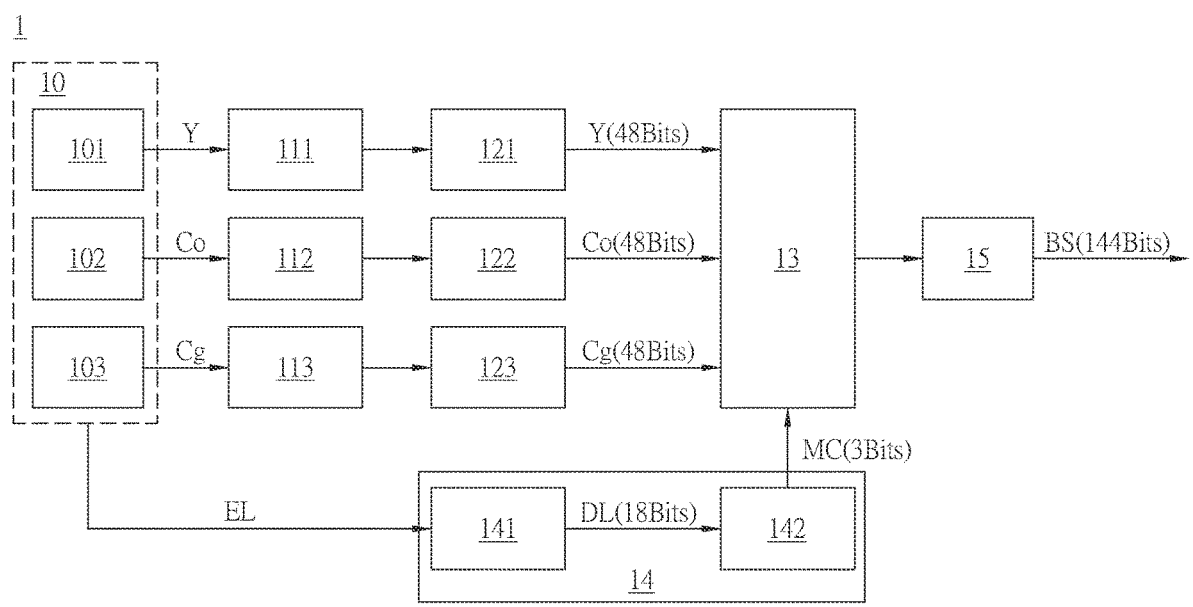
FIG. 1 illustrates a schematic diagram of the stream decompression circuit applied to the VESA DSC multiplexer circuit in a preferred embodiment of the invention.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment of the invention is a stream decompression circuit. In this embodiment, the stream decompression circuit is applied to a VESA display stream compression (DSC) multiplexer circuit, but not limited to this.

Please refer to FIG. 1. FIG. 1 illustrates a schematic diagram of the stream decompression circuit applied to the VESA DSC multiplexer circuit in this embodiment.

As shown in FIG. 1, the stream decompression circuit 14 is applied to the VESA DSC multiplexer circuit 1. The stream decompression circuit 14 is coupled between a variable length coding (VLC) circuit 10 and a multiplexer circuit 13. The VLC circuit 10 includes a first variable length coder 101, a second variable length coder 102 and a third variable length coder 103, which are configured to code a first sub-stream Y, a second sub-stream Co and a third sub-stream Cg of the plurality of sub-streams respectively.

The first variable length coder 101, the second variable length coder 102 and the third variable length coder 103 are coupled to a first shifter 111, a second shifter 112 and a third shifter 113 respectively. The first shifter 111, the second shifter 112 and the third shifter 113 are configured to accumulate a coding length that the first variable length coder 101, the second variable length coder 102 and the third variable length coder 103 code the first sub-stream Y, the second sub-stream Co and the third sub-stream Cg respectively and output the first sub-stream Y, the second sub-stream Co and the third sub-stream Cg when the coding length accumulates over a specific number of bits.

In practical applications, the first shifter 111, the second shifter 112 and the third shifter 113 can be funnel shifters, but not limited to this; the specific number of bits can include numbers of bits of the first sub-stream Y, the second sub-stream Co and the third sub-stream Cg respectively, but not limited to this.

The first shifter 111, the second shifter 112 and the third shifter 113 are coupled to a first balance first-in first-out (FIFO) 121, a second balance FIFO 122 and a third balance FIFO 123 respectively. The first balance FIFO 121, the second balance FIFO 122 and the third balance FIFO 123 are configured to store the first sub-stream Y, the second sub-stream Y and the third sub-stream Cg having the coding length equal to a specific number of bits (for example, 48 bits) respectively.

In this embodiment, the stream decompression circuit 14 includes a coding length FIFO 141 and a calculation circuit 142. The coding length FIFO 141 is coupled to the VLC circuit 10 for storing the coding length EL that the VLC circuit 10 codes the plurality of sub-streams (the first sub-stream Y, the second sub-stream Co and the third sub-stream Cg) and outputting a specific number of bits DL when the coding length EL cumulatively exceeds the specific number of bits DL.

The calculation circuit 142 is coupled between the coding length FIFO 141 and the multiplexer circuit 13 and configured to calculate a number of bits needed for decompression according to the specific number of bits DL and output a multiplexer control signal MC including a flag to the multiplexer circuit 13 to control the multiplexer circuit 13 to output the plurality of sub-streams (the first sub-stream Y, the second sub-stream Co and the third sub-stream Cg) in a specific order. It should be noted that in this embodiment, the specific number of bits DL is 18 bits and the multiplexer control signal MC has 3 bits (for example, including 1 bit of the first sub-stream Y, 1 bit of the second sub-stream Co and 1 bit of the third sub-stream Cg respectively), but not limited to this.

Assuming that a storage capacity of the coding length FIFO 141 is (144×18) bits, the coding length FIFO 141 can store a total of 144 18-bit data from the coding length EL, and the calculation circuit 142 each time reads one 18-bit data from the coding length FIFO 141 and performs calculations to obtain a 3-bit multiplexer control signal MC (for example, including 1 bit of the flag corresponding to the first sub-stream Y, 1 bit of the flag corresponding to the second sub-stream Co and 1 bit of the flag corresponding to the third sub-stream Cg, but not limited to this.

The multiplexer circuit 13 is also coupled to the first balance FIFO 121, the second balance FIFO 122, the third balance FIFO 123 and the rate buffer 15 for outputting the first sub-stream Y, the second sub-stream Co and the third sub-stream Cg each having 48 bits to the rate buffer 15 in a specific order according to the multiplexer control signal MC. The rate buffer 15 outputs a 144-bit bit stream BS according to the first sub-stream Y, the second sub-stream Co and the third sub-stream Cg each having 48 bits.

By doing so, the stream decompression circuit 14 can control the multiplexer circuit 13 to output the three sub-streams Y/Co/Cg in the VESA DSC coding stream to the rate buffer 15 in the correct order. Therefore, it can effectively replace the stream decoder with complex circuit architecture and high hardware design cost, thereby achieving the effects of simplifying the circuit architecture and reducing costs.

Figure 2:
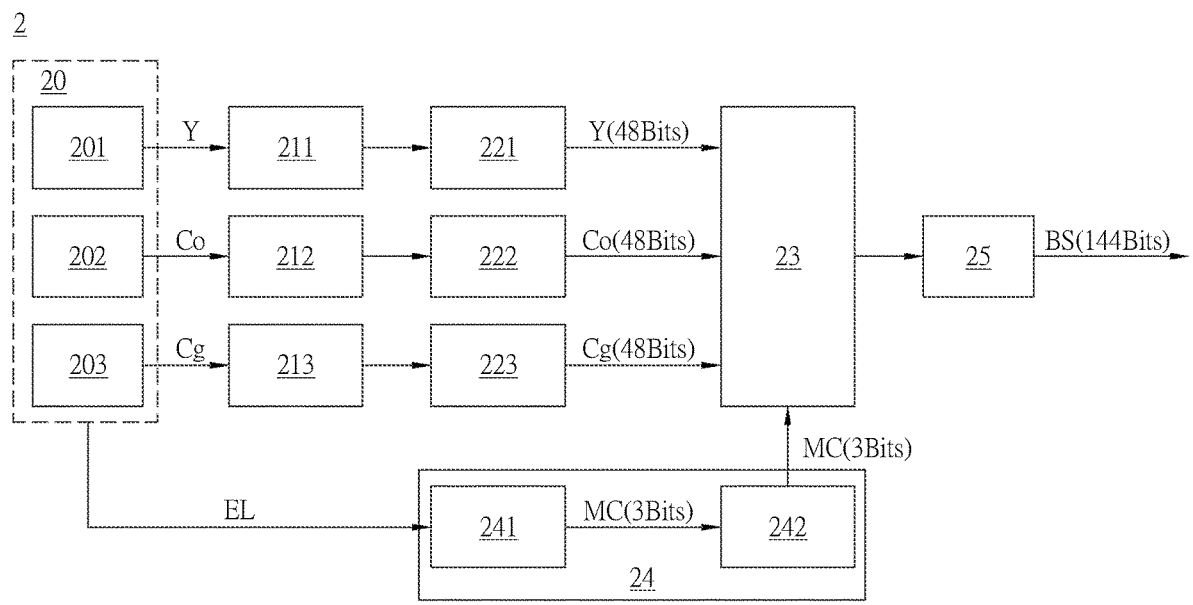
FIG. 2 illustrates a schematic diagram of the stream decompression circuit applied to the VESA DSC multiplexer circuit in another preferred embodiment of the invention.

In another embodiment, please refer to FIG. 2, a stream decompression circuit 24 is applied to a VESA DSC multiplexer circuit 2. The stream decompression circuit 24 is coupled between a VLC circuit 20 and a multiplexer circuit 23. The VLC circuit 20 includes a first variable length coder 201, a second variable length coder 202 and a third variable length coder 203, which are configured to separately code a first sub-stream Y, a second sub-stream Co and a third sub-stream Cg of the sub-streams.

The first variable length coder 201, the second variable length coder 202 and the third variable length coder 203 are coupled to a first shifter 211, a second shifter 212 and a third shifter 213 respectively. The first shifter 211, the second shifter 212 and the third shifter 213 are configured to accumulate a coding length that the first variable length coder 201, the second variable length coder 202 and the third variable length coder 203 code the first sub-stream Y, the second sub-stream Co and the third sub-stream Cg respectively and output the first sub-stream Y, the second sub-stream Co, and the third sub-stream Cg when the coding length accumulates over a specific number of bits.

The first shifter 211, the second shifter 212 and the third shifter 213 are coupled to the first balance FIFO 221, the second balance FIFO 222 and the third balance FIFO 223 respectively. The first balance FIFO 221, the second balance FIFO 222, and the third balance FIFO 223 are configured to store the first sub-stream Y, the second sub-stream Co and the third sub-stream Cg having a specific number of bits (for example, 48 bits).

In this embodiment, the stream decompression circuit 24 includes a calculation circuit 241 and a flag FIFO 242. The calculation circuit 241 is coupled to the VLC circuit 20 for real-time calculating the coding length EL that the VLC circuit 20 codes the plurality of sub-streams (the first sub-stream Y, the second sub-stream Co and the third sub-stream Stream Cg) to obtain a multiplexer control signal MC including a flag to indicate when the multiplexer circuit 23 needs to output the plurality of sub-streams (the first sub-stream Y, the second sub-stream Co and the third sub-stream Cg) and outputting the to the multiplexer control signal MC including the flag to the flag FIFO 242.

The flag FIFO 242 is coupled between the calculation circuit 241 and the multiplexer circuit 23 for storing the multiplex control signal MC including the flag. The multiplexer circuit 23 is also coupled to the first balance FIFO 221, the second balance FIFO 222, the third balance FIFO 223 and the rate buffer 25, and the multiplexer circuit 23 is configured to output the first sub-stream Y, the second sub-stream Co and the third sub-stream Cg to the rate buffer 25 in a specific order according to the flag of the multiplexer control signal MC.

It should be noted that the specific number of bits EL in this embodiment is 18 bits and it includes numbers of bits of the first sub-stream Y, the second sub-stream Co and the third sub-stream Cg respectively, but not limited to this. The multiplexer control signal MC has 3 bits, which includes 1 bit of the flag corresponding to the first sub-stream Y, 1 bit of the flag corresponding to the second sub-stream Co and 1 bit of the flag corresponding to the third sub-stream Cg. It is assumed that the calculation circuit 241 calculates the coding length EL having 18 bits in real time to obtain the multiplexer control signal MC having 3-bit (including 1 bit of the flag corresponding to the first sub-stream Y, 1 bit of the flag corresponding to the second sub-stream Co and 1 bit of the flag corresponding to the third sub-stream Cg) and stores it in the flag FIFO 242, so that a storage capacity of the flag FIFO 242 only needs (144x3) bits to store 144 3-bit multiplexer control signals MC. The multiplexer circuit 23 each time reads one 3-bit multiplexer control signal MC from the flag FIFO 242 and outputs the first sub-stream Y, the second sub-stream Co and the third sub-stream Cg to the rate buffer 25 in a specific order according to the flags corresponding to the first sub-stream Y, the second sub-stream Co and the third sub-stream Cg in the multiplexer control signal MC, but not limited to this.

In other words, if 144 data are stored in the same way, the storage capacity (144×3 bits) required for the flag indicator FIFO 242 in FIG. 2 is only one-sixth of the storage capacity (144×18 bits) required for the coding length FIFO 141 in FIG. 1, and the calculation circuit 241 in FIG. 2 is the same as the calculation circuit 142 in FIG. 1, so the invention can effectively reduce the hardware cost.

By doing so, the stream decompression circuit 24 can control the multiplexer circuit 23 to output the three sub-streams Y/Co/Cg in the VESA DSC coding stream to the rate buffer 25 in the correct order. Therefore, it can effectively replace the stream decoder having complex circuit structure and high hardware design cost, thereby achieving effects of simplifying circuit structure and reducing costs.

Next, please refer to FIG. 3. FIG. 3 illustrates a schematic diagram of the calculation circuit 241 in FIG. 2 calculating the flags of the three sub-streams Y/Co/Cg.

As shown in FIG. 3, if the decimal coding length is taken as an example for description, if the three sub-streams {Y1,Co,Cg}={00,00,00} at the beginning, the initial remaining bits corresponding to the sub-streams Y1, Co, and Cg are 48, 48 and 48 respectively and the initial flags corresponding to the sub-streams Y1, Co, and Cg are 1, 1 and 1 respectively.

Next, if the three sub-streams {Y1,Co,Cg}={21,36,09}, the remaining bits corresponding to the three sub-streams Y1, Co, Cg are 48−21=27<36, 48−36=12<36, 48−9=39>36 respectively, since the remaining bits corresponding to sub-streams Y1 and Co are already less than the specific number of bits 36 (represented by slashes), the flags corresponding to the three sub-streams Y1, Co, Cg are 1, 1 and 0 respectively.

Then, if the three sub-streams {Y1,Co,Cg}={12,05,05}, the remaining bits corresponding to the sub-streams Y1, Co and Cg are 27+48−12=63>36, 12+48−5=55>36, 39−5=34<36 respectively, since the remaining bits corresponding to the sub-stream Cg is already less than the specific number of bits 36 (represented by slashes), the flags corresponding to the three sub-streams Y1, Co and Cg are 0, 0 and 1 respectively.

Next, if the three sub-streams {Y1,Co,Cg}={08,25,12}, the remaining bits corresponding to the sub-streams Y1, Co and Cg are 63−8=55>36, 55−25=30<36, 34+48−12=70>36 respectively, since the remaining bits corresponding to the sub-stream Co is less than the specific number of bits 36 (represented by slashes), the flags corresponding to the three sub-streams Y1, Co and Cg are 0, 1 and 0 respectively.

Then, if the three sub-streams {Y1,Co,Cg}={08,08,07}, the remaining bits corresponding to the sub-streams Y1, Co, and Cg are 55−8=47>36, 30+48−8=70>36, 70−7=63>36 respectively, since the remaining bits corresponding to the sub-streams Y1, Co, Cg are not less than the specific number of bits 36, the flags corresponding to the three sub-streams Y1, Co and Cg are 0, 0 and 0 respectively.

Next, if the three sub-streams {Y1,Co,Cg}={04,08,09}, the remaining bits corresponding to the sub-streams Y1, Co, and Cg are 47−4=43>36, 70−8=62>36, 63−9=54>36 respectively, since the remaining bits corresponding to the sub-streams Y1, Co, and Cg are not less than the specific number of bits 36, the flags corresponding to the three sub-streams Y1, Co and Cg are 0, 0 and 0 respectively.

Then, if the three sub-streams {Y1, Co,Cg}=101,12,121, the remaining bits corresponding to the sub-streams Y1, Co, Cg are 43−1=42>36, 62−12=50>36, 54−12=42>36 respectively, since none of the remaining bits corresponding to the sub-streams Y1, Co, Cg is less than the specific number of bits 36, the flags corresponding to the sub-streams Y1, Co, Cg are 0, 0 and 0 respectively.

Next, if the three sub-streams {Y1,Co,Cg}={09,04,04}, the remaining bits corresponding to the three sub-streams Y1, Co, Cg are 42−9=33<36, 50−4=46>36, 42−4=38>36 respectively, since the remaining bits corresponding to the sub-stream Y1 is already less than the specific bit number 36 (represented by slashes), the flags corresponding to the sub-streams Y1, Co, Cg are 1, 0 and 0 respectively.

Then, if the three sub-streams {Y1,Co,Cg}={04,01,01}, the remaining bits corresponding to the three sub-streams Y1, Co, Cg are 33+48−4=77>36, 46−1=45>36, 38−1=37>36 respectively, since the remaining bits corresponding to the sub-streams Y1, Co, and Cg are not less than the specific number of bits 36, the flags corresponding to the sub-streams Y1, Co, and Cg are 0, 0 and 0 respectively.

Next, if the three sub-streams {Y1,Co,Cg}={05,05,13}, the remaining bits corresponding to the sub-streams Y1, Co, Cg are 77−5=72>36, 45−5=40>36, 37−13=24<36 respectively, since the remaining bits corresponding to the sub-stream Cg is less than the specific number of bits 36 (represented by slashes), the flags corresponding to the sub-streams Y1, Co, and Cg are 0, 0 and 1 respectively.

After that, if the three sub-streams {Y1,Co,Cg}={05,04,07}, the remaining bits corresponding to the sub-streams Y1, Co, and Cg are 72−5=67>36, 40−4=36, 24+48−7=65>36 respectively, since the remaining bits corresponding to the sub-streams Y1, Co, and Cg are not less than the specific number of bits 36, the flags corresponding to the sub-streams Y1, Co, and Cg are 0, 0 and 0 respectively. The rest can be deduced by analogy, so it will not be repeated here.

Figure 4:
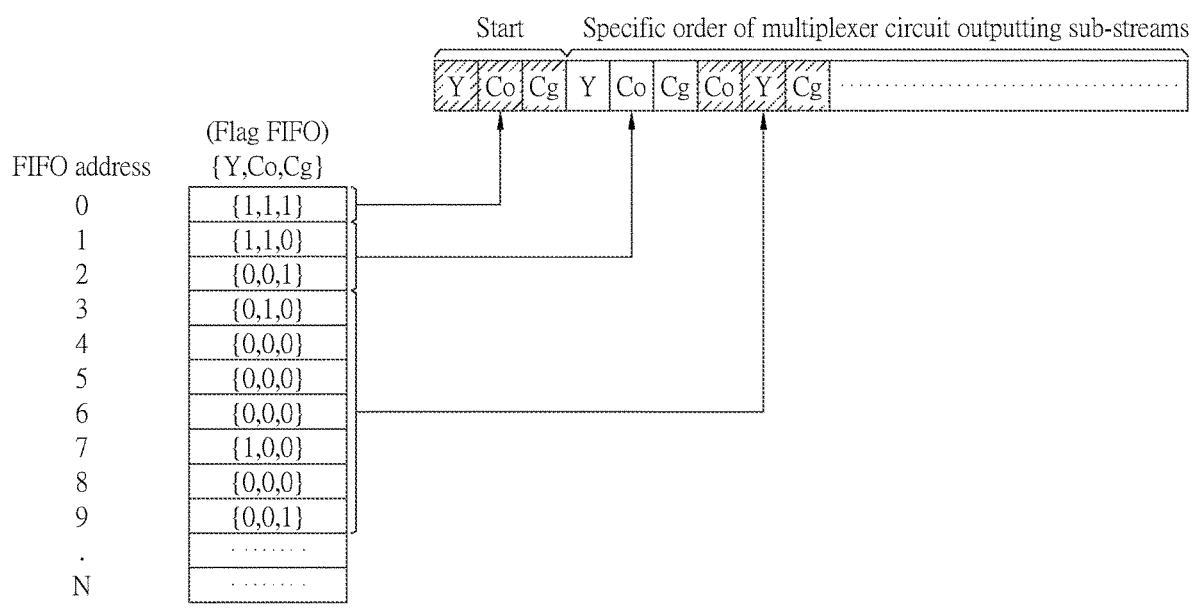
FIG. 4 illustrates a schematic diagram of the multiplexer circuit outputting the sub-streams to the rate buffer according to the flags of the multiplex control signal.

Please refer to FIG. 4. FIG. 4 illustrates a schematic diagram of the multiplexer circuit outputting the sub-streams to the rate buffer according to the flag of the multiplexer control signal.

As shown in FIG. 4, assuming that the flags corresponding to the sub-streams Y, Co, and Cg at the FIFO addresses 0~N obtained according to FIG. 3 are {1, 1, 1}, {1, 1,0}, {0,0,1}, {0,1,0}, {0,0,0}, {0,0,0}, {0,0,0}, {1,0, 0}, {0,0,0}, {0,0,1}, . . . etc., and the 3-bit multiplex control signal MC including the above flags are stored in the flag FIFO 242.

When the FIFO address is 0, since the flags corresponding to the sub-streams Y, Co, and Cg in the multiplexer control signal MC are {1, 1, 1}, the multiplexer circuit 23 outputs the sub-streams Y, Co, and Cg to the rate buffer 25 in order according to the multiplexer control signal MC.

When the FIFO address is 1, since the flags corresponding to the sub-streams Y, Co, and Cg in the multiplexer control signal MC are {1,1,0}, the multiplexer circuit 23 outputs the sub-streams Y and Co to the rate buffer 25 in order according to the multiplexer control signal MC. Then, when the FIFO address is 2, since the flags corresponding to the sub-streams Y, Co, and Cg in the multiplexer control signal MC are {0,0,1}, the multiplexer circuit 23 outputs the sub-stream Cg to the rate buffer 25 according to the multiplexer control signal MC. In other words, when the FIFO address is 1 to 2, the multiplexer circuit 23 outputs the three sub-streams in the order of Y, Co and Cg according to the multiplexer control signal MC.

When the FIFO address is 3, since the flags corresponding to the sub-streams Y, Co, and Cg in the multiplexer control signal MC is {0,1,0}, the multiplexer circuit 23 outputs the sub-stream Co to the rate buffer 25 according to the multiplexer control signal MC. When the FIFO address is 4 to 6, since the flags corresponding to the sub-streams Y, Co, and Cg in the multiplexer control signal MC are all {0,0,0}, the multiplexer circuit 23 does not output the sub-stream to the rate buffer 25. When the FIFO address is 7, since the flags corresponding to the sub-streams Y, Co, and Cg in the multiplexer control signal MC are {1,0,0}, the multiplexer circuit 23 outputs the sub-stream Y to the rate buffer 25 according to the multiplexer control signal MC. When the FIFO address is 8, since the flags corresponding to the sub-streams Y, Co, and Cg in the multiplexer control signal MC are all {0,0,0}, the multiplexer circuit 23 does not output the sub-streams to the rate buffer 25. When the FIFO address is 9, since the flags corresponding to the sub-streams Y, Co, and Cg in the multiplexer control signal MC is {0,0,1}, the multiplexer circuit 23 outputs the sub-stream Cg to the rate buffer 25 according to the multiplexer control signal MC. In other words, when the FIFO addresses is 3 to 9, the multiplexer circuit 23 outputs the three sub-streams in the order of Co, Y and Cg according to the multiplexer control signal MC. The rest can be deduced by analogy, so they will not be repeated here.

Figure 5:
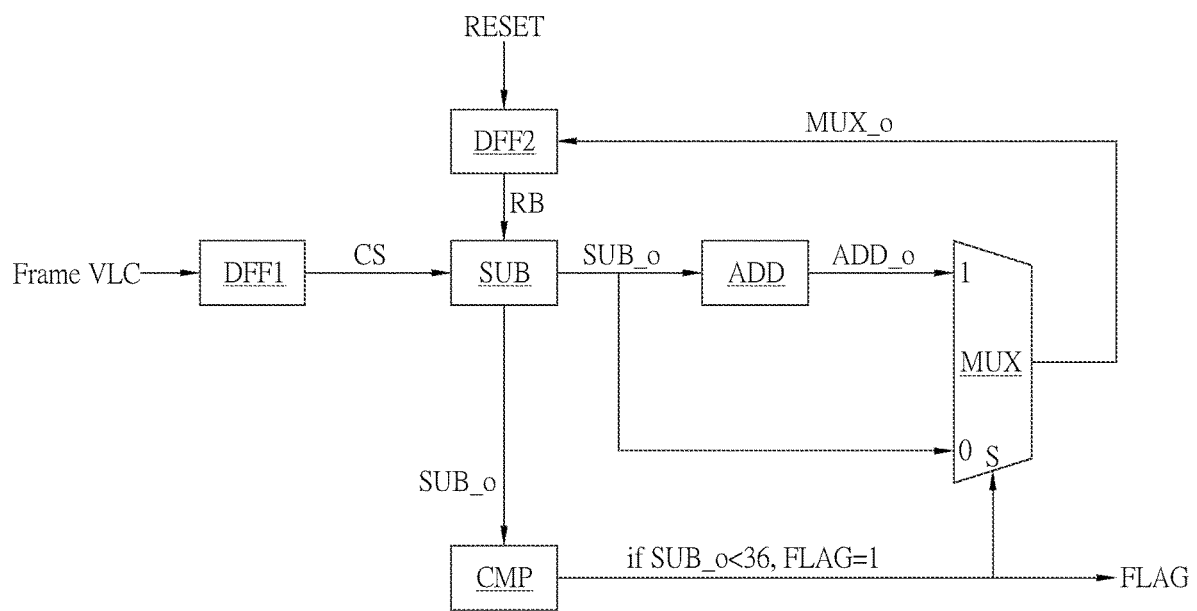
FIG. 5 illustrates a functional block diagram of an embodiment of the calculation circuit 241 in FIG. 2.

Please refer to FIG. 5. FIG. 5 illustrates a functional block diagram of an embodiment of the calculation circuit 241 in FIG. 2. As shown in FIG. 5, the calculation circuit can include positive edge flip-flops DFF1~DFF2, a subtractor SUB, an adder ADD, a comparator CMP and a multiplexer MUX. The positive edge flip-flops DFF1~DFF2 are respectively coupled to the subtractor SUB. The subtractor SUB is respectively coupled to the adder ADD and the comparator CMP. The adder ADD is coupled to the subtractor SUB and the multiplexer MUX. The multiplexer MUX is respectively coupled to the comparator CMP, the subtractor SUB, the adder ADD and the positive edge flip-flop DFF2.

The positive edge flip-flop DFF1 provides the coding length CS to the subtractor SUB according to the frame VLC. The positive edge flip-flop DFF2 provides the remaining bits RB to the subtractor SUB according to the reset signal RESET. The subtractor SUB subtracts the coding length CS from the remaining bits RB to obtain the subtracted remaining bits SUB_o and provides the subtracted remaining bits SUB_o to the adder ADD, the comparator CMP and the multiplexer MUX respectively.

The comparator CMP compares the remaining bits SUB_o after subtraction with the specific number of bits 36 and outputs a flag signal FLAG to the input terminal S of the multiplexer MUX according to the comparison result. If the remaining bits SUB_o after subtraction is less than the specific number of bits 36, the flag signal FLAG=1; if the remaining bits SUB_o after subtraction is not less than the specific number of bits 36, then the flag signal FLAG=0.

The adder ADD adds the remaining bits SUB_o after subtraction to the original number of bits 48 of the sub-stream and outputs the remaining bits ADD_o after addition to the input terminal 1 of the multiplexer MUX. As for the input terminal 0 of the multiplexer MUX, the remaining bits SUB_o after subtraction is received. The multiplexer MUX selectively outputs the remaining bits ADD_o after addition or the remaining bits SUB_o after subtraction according to the flag signal FLAG being 1 or 0 as the remaining bits MUX_o of the multiplexer output to the positive edge Flip-flop DFF2. The rest can be deduced by analogy, so they will not be repeated here.

Figure 6:
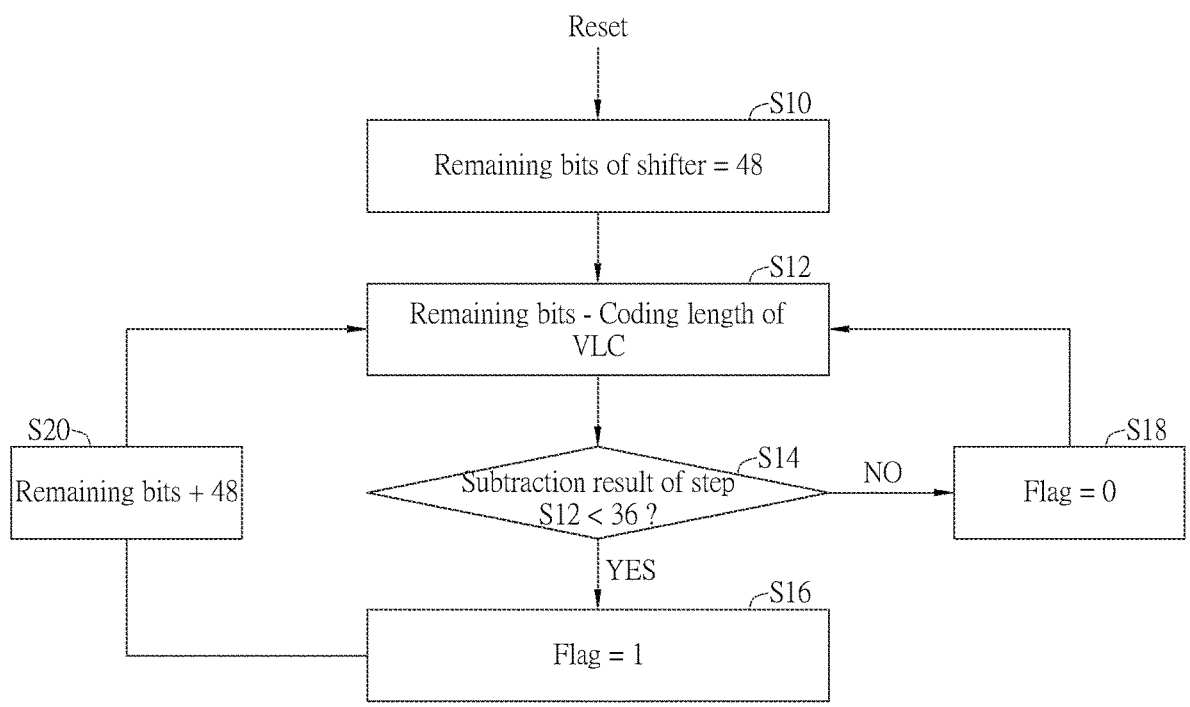
FIG. 6 illustrates a flowchart of an embodiment of operating the calculation circuit 241 in FIG. 2.

Please also refer to FIG. 6. FIG. 6 illustrates a flowchart of an embodiment when the calculation circuit operates. As shown in FIG. 6, after resetting, if the remaining bits in the shifter=48 (step S10), then the remaining bits is subtracted from the coding length of the VLC (step S12) and determined whether the subtraction result of step S12 is smaller than the specific number of bits 36 (step S14).

If the determination result of step S14 is yes, it means that the remaining bits minus the coding length of VLC is less than the specific number of bits 36, then the flag=1 (step S16) and the remaining bits are added to the original bit number of the stream 48 (step S20) and then return to step S12.

If the determination result of step S14 is no, it means that the remaining bits minus the coding length of VLC is not less than the specific number of bits 36, then the flag=0 (step S18) and return to step S12. The rest can be deduced by analogy and will not be repeated here.

Compared to the prior art, the stream decompression circuit of the invention does not require a stream decoder with a complicated circuit structure and a high hardware design cost to control the multiplexer circuit to output three sub-streams Y/Co/Cg in the VESA DSC coded stream to the rate buffer in the correct order, so the circuit architecture can be greatly simplified and the cost can be reduced, which helps to enhance the competitiveness of the product in the market.

What is claimed is:

1. A stream decompression circuit, coupled between a variable length coding (VLC) circuit and a multiplexer circuit, the stream decompression circuit comprising:
   a coding length first-in-first-out (FIFO), coupled to the VLC circuit, configured to store a coding length that the VLC circuit codes a plurality of sub-streams and output a specific number of bits when the coding length accumulates over the specific number of bits; and
   a calculation circuit, coupled between the coding length FIFO and the multiplexer circuit, configured to calculate a number of bits required for decompression and output a multiplex control signal comprising a fag to the multiplexer circuit to control the multiplexer circuit to output the plurality of sub-streams according to a specific order.

2. The stream decompression circuit of claim 1, wherein the VLC circuit comprises a first variable length coder, a second variable length coder and a third variable length coder configured to code a first sub-stream, a second sub-stream and a third sub-stream of the plurality of sub-streams respectively.

3. The stream decompression circuit of claim 2, wherein the first variable length coder, the second variable length coder and the third variable length coder are coupled to a first shifter, a second shifter and a third shifter respectively, the first shifter, the second shifter and the third shifter are configured to accumulate the coding length that the first variable length coder, the second variable length coder and the third variable length coder code the first sub-stream, the second sub-stream and the third sub-stream respectively and output the first sub-stream, the second sub-stream and the third sub-stream when the coding length accumulates over the specific number of bits.

4. The stream decompression circuit of claim 3, wherein the first shifter, the second shifter and the third shifter are coupled to a first balance FIFO, a second balance FIFO and a third balance FIFO respectively, the first balance FIFO, the second balance FIFO and the third balance FIFO are configured to store the first sub-stream, the second sub-stream and the third sub-stream having the coding length equal to the specific number of bits.

5. The stream decompression circuit of claim 4, wherein the multiplexer circuit is further coupled to the first balance FIFO, the second balance FIFO, the third balance FIFO and a rate buffer and configured to output the first sub-stream, the second sub-stream and the third sub-stream to the rate buffer in the specific order according to the flag of the multiplex control signal.

6. The stream decompression circuit of claim 2, wherein the specific number of bits comprises numbers of bits of the first sub-stream, the second sub-stream and the third sub-stream respectively.

7. The stream decompression circuit of claim 2, wherein the specific number of bits is 18 bits comprising 6 bits of the first sub-stream, 6 bits of the second sub-stream and 6 bits of the third sub-stream respectively, while the multiplex control signal has 3 bits comprising 1 bit of the first sub-stream, 1 bit of the second sub-stream and 1 bit of the third sub-stream respectively.

8. A stream decompression circuit, coupled between a variable length coding (VLC) circuit and a multiplexer circuit, the stream decompression circuit comprising:
   a calculation circuit, coupled to the VLC circuit, configured to calculate when the multiplexer circuit needs to output a plurality of sub-streams according to a coding length that the VLC circuit codes the plurality of sub-streams and output a multiplex control signal comprising a flag; and
   a flag first-in-first-out (FIFO), coupled between the calculation circuit and the multiplexer circuit and configured to store the multiplex control signal, and the multiplexer circuit outputting the plurality of sub-streams in a specific order according to the flag of the multiplex control signal.

9. The stream decompression circuit of claim 8, wherein when the VLC circuit comprises a first variable length coder, a second variable length coder and a third variable length coder configured to code a first sub-stream, a second sub-stream and a third sub-stream of the plurality of sub-streams respectively.

10. The stream decompression circuit of claim 9, wherein the first variable length coder, the second variable length coder and the third variable length coder are coupled to a first shifter, a second shifter and a third shifter respectively, the first shifter, the second shifter and the third shifter are configured to accumulate the coding length that the first variable length coder, the second variable length coder and the third variable length coder code the first sub-stream, the second sub-stream and the third sub-stream respectively and output the first sub-stream, the second sub-stream and the third sub-stream when the coding length accumulates over a specific number of bits.

11. The stream decompression circuit of claim 10, wherein the first shifter, the second shifter and the third shifter are coupled to a first balance FIFO, a second balance FIFO and a third balance FIFO respectively, the first balance FIFO, the second balance FIFO and the third balance FIFO are configured to store the first sub-stream, the second sub-stream and the third sub-stream having the coding length equal to the specific number of bits.

12. The stream decompression circuit of claim 11, wherein the multiplexer circuit is further coupled to the first balance FIFO, the second balance FIFO, the third balance FIFO and a rate buffer and configured to output the first sub-stream, the second sub-stream and the third sub-stream to the rate buffer in the specific order according to the flag of the multiplex control signal.

13. The stream decompression circuit of claim 9, wherein the specific number of bits comprises numbers of bits of the first sub-stream, the second sub-stream and the third sub-stream respectively.

14. The stream decompression circuit of claim 9, wherein the multiplex control signal has 3 bits comprising 1 bit of the first sub-stream, 1 bit of the second sub-stream and 1 bit of the third sub-stream respectively.

\* \* \* \* \*